US008535066B2

(12) United States Patent
Li et al.

(10) Patent No.: US 8,535,066 B2
(45) Date of Patent: Sep. 17, 2013

(54) ELECTRONIC DEVICE AND INFRARED RECEIVING DEVICE THEREOF

(75) Inventors: Hong Li, Shenzhen (CN); Ke-Hui Peng, Shenzhen (CN); Li-Ni Liang, Shenzhen (CN); Ren-Wen Wang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 63 days.

(21) Appl. No.: 13/246,031

(22) Filed: Sep. 27, 2011

(65) Prior Publication Data

US 2012/0225572 A1 Sep. 6, 2012

(30) Foreign Application Priority Data

Mar. 2, 2011 (CN) .......................... 2011 1 0050192

(51) Int. Cl.
*H01R 12/00* (2006.01)
(52) U.S. Cl.
USPC ........................... 439/76.1; 439/910; 361/752

(58) Field of Classification Search
USPC .................. 439/55, 76.1, 910; 361/752, 800, 361/801
See application file for complete search history.

(56) References Cited

U.S. PATENT DOCUMENTS

| | | | | |
|---|---|---|---|---|
| 5,780,775 | A * | 7/1998 | Yu ................................. | 174/135 |
| 7,025,274 | B2 * | 4/2006 | Solomon et al. .......... | 235/472.01 |
| 7,144,279 | B2 * | 12/2006 | Zahnen et al. ................ | 439/709 |
| 7,255,623 | B2 * | 8/2007 | Davis .............................. | 446/36 |

* cited by examiner

*Primary Examiner* — Khiem Nguyen
(74) *Attorney, Agent, or Firm* — Altis Law Group, Inc.

(57) ABSTRACT

An electronic device includes a housing, a circuit board, an infrared receiving device and a protection cover. The protection cover is engaged in the window of the housing to cover the infrared receiving device. The protection cover includes a blocking plate, a side wall extending outwardly from the blocking plate, and two clasping ears respectively located at two opposite sides of the side wall. The blocking plate is attached to the housing, and the two clasping ears of the protection cover provide a permanent means of securing the protection cover to the housing.

11 Claims, 6 Drawing Sheets

ELECTRONIC DEVICE AND INFRARED RECEIVING DEVICE THEREOF

BACKGROUND

1. Technical Field

The disclosure relates to electronic devices, and particularly to an electronic device including an infrared (IR) receiving device for receiving an IR signal.

2. Description of Related Art

Some electronic devices such as Digital Video Disc (DVD) players include an IR receiving device for receiving IR signals, and there is a transparent cover fixed in front of the IR receiving device to protect it. The loss of the transparent cover may cause malfunction of the electronic device.

What is needed, therefore, is an electronic device which can overcome the above-described problems.

BRIEF DESCRIPTION OF THE DRAWINGS

Many aspects of the present embodiments can be better understood with reference to the following drawings. The components in the drawings are not necessarily drawn to scale, the emphasis instead placed upon clearly illustrating the principles of the present embodiments. Moreover, in the drawings, like reference numerals designate corresponding parts throughout the various views.

DETAILED DESCRIPTION

Figure 1:
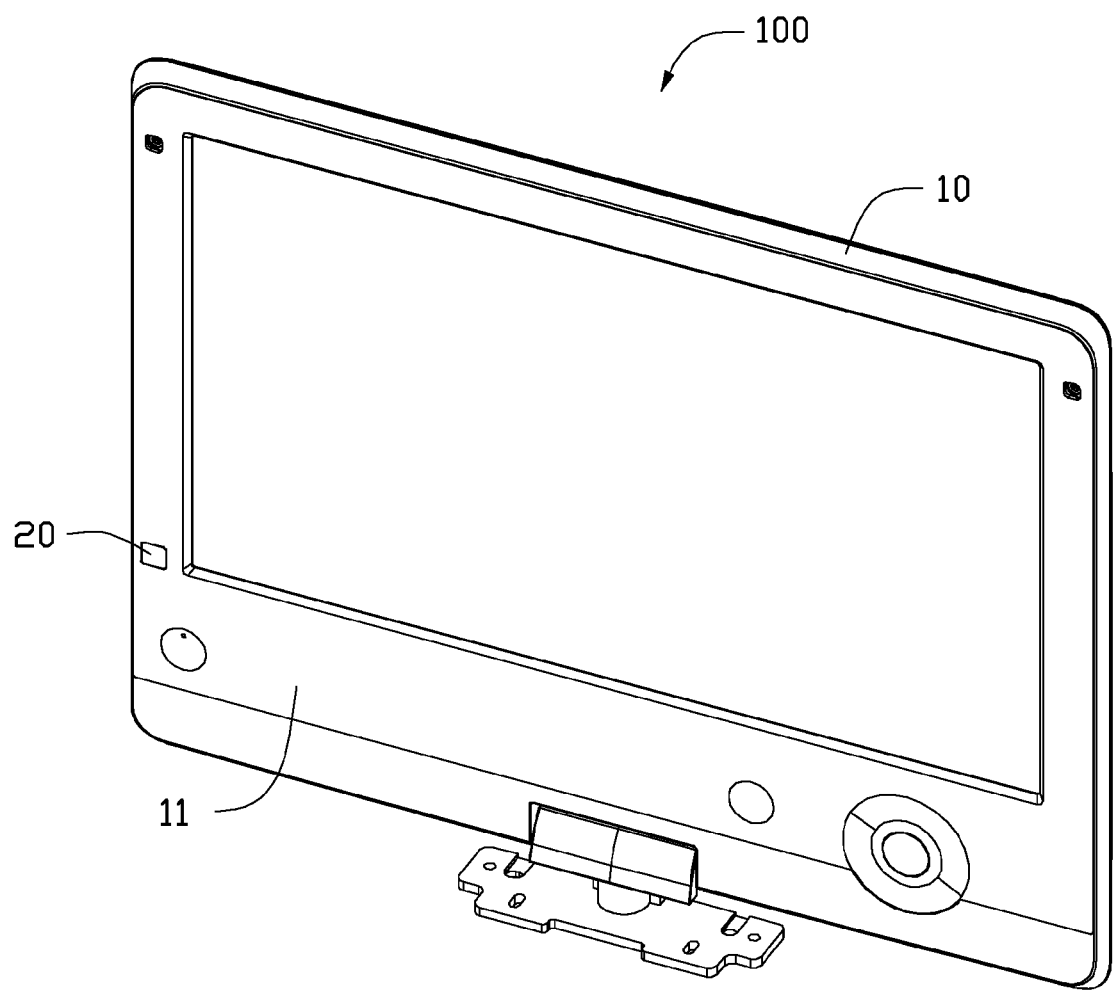
FIG. 1 is an isometric view of an electronic device in accordance with an embodiment of the disclosure.
Figure 2:
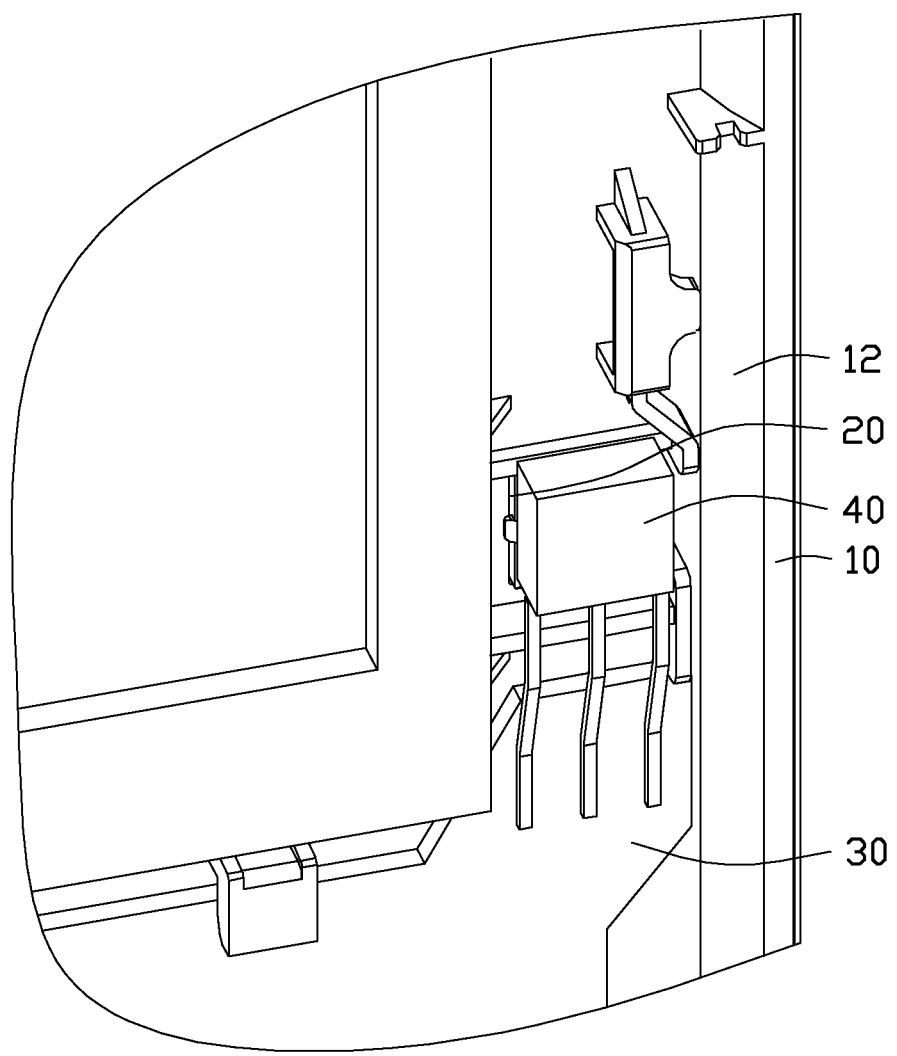
FIG. 2 is an enlarged view of an inner part of the electronic device of FIG. 1, showing the protection cover coupled to a window of the electronic device in front of an IR receiving device.

Referring to FIGS. 1 and 2, an electronic device 100 in accordance with an embodiment of the disclosure is illustrated. The electronic device 100 includes a housing 10, a protection cover 20, a circuit board 30 and an infrared (IR) receiving device 40. The electronic device 100 can be a display unit, a DVD player, a notebook computer, a projector or the like. The housing 10 has an outer surface 11 and an opposite inner surface 12. The circuit board 30 and the IR receiving device 40 are received in the housing 10. The protection cover 20 is fixed on the housing for the protection of the IR receiving device 40.

Figure 3:
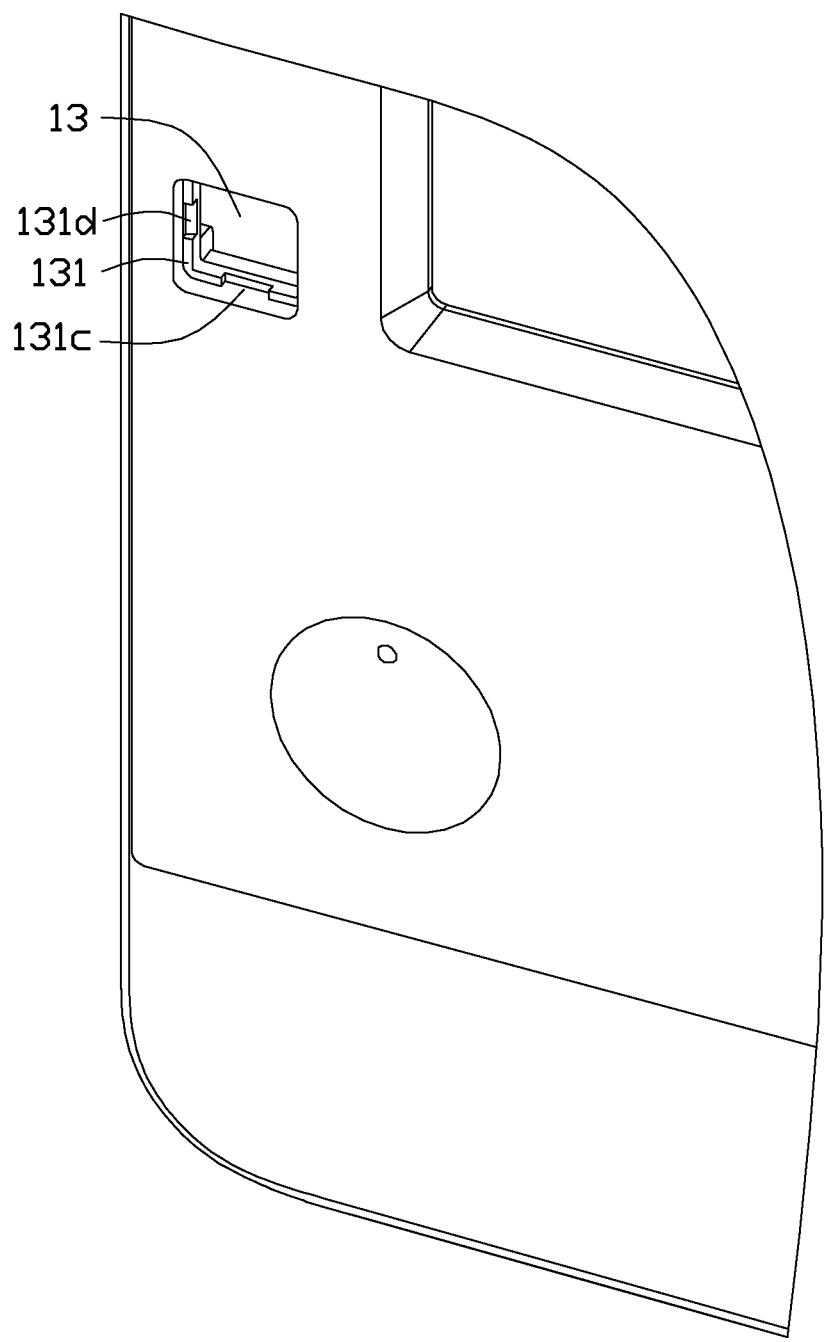
FIG. 3 is an enlarged view of part of the housing of the electronic device of FIG. 1.
Figure 4:
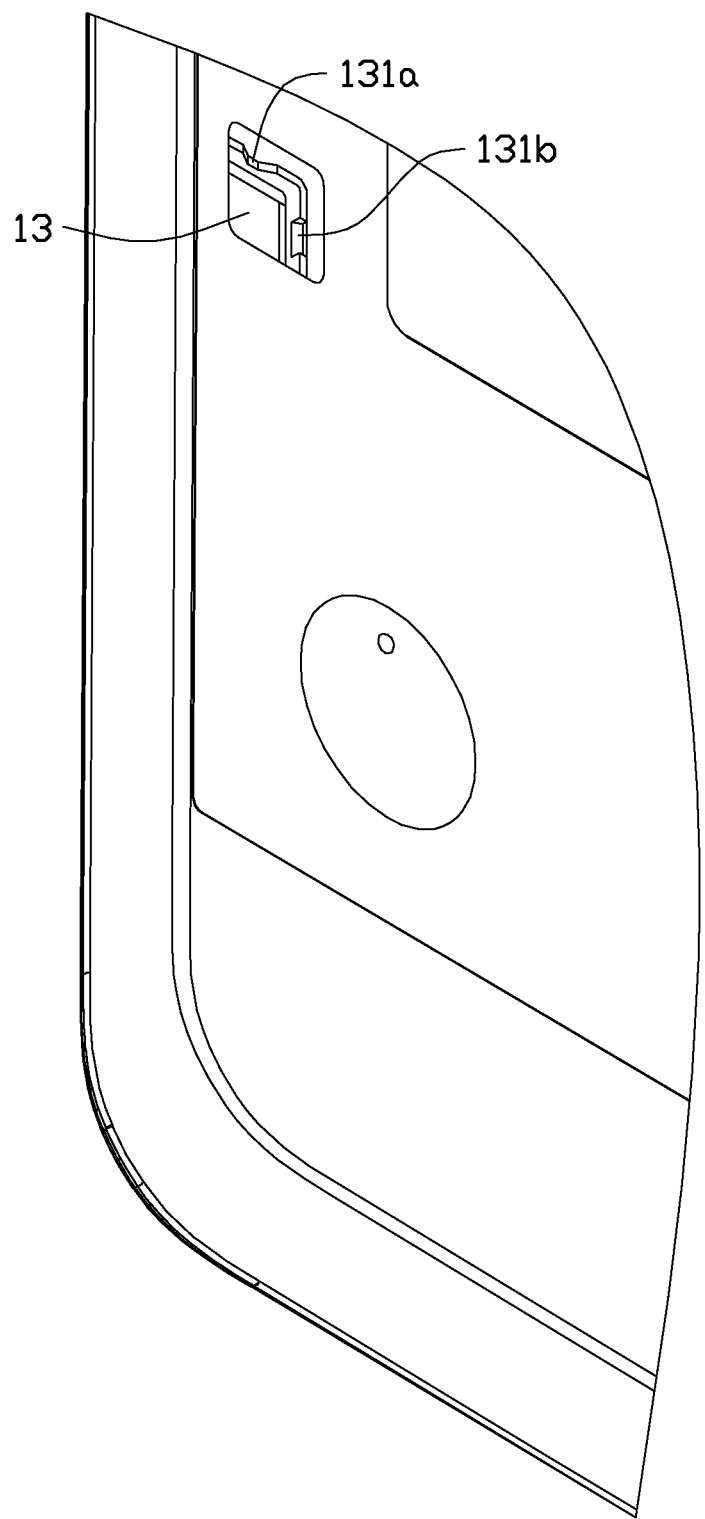
FIG. 4 is a view similar to FIG. 3, but shown from a different aspect.

Referring to FIGS. 3 and 4, the housing 10 defines a window 13 through the outer surface 11 and the inner surface 12. The window 13 is rectangular and defines a stepped structure 131 therein. Each side of the stepped structure 131, close to the outer surface 11, has a groove (grooves 131a, 131b, 132c, and 131d).

The circuit board 30 is received in the housing 10 and disposed on the inner surface 12. The infrared receiving device 40 is placed in the housing 10 and faces the window 13. The infrared receiving device 40 is electrically connected to the circuit board 30 and receives infrared (IR) signals through the transparent protection cover 20.

Figure 5:
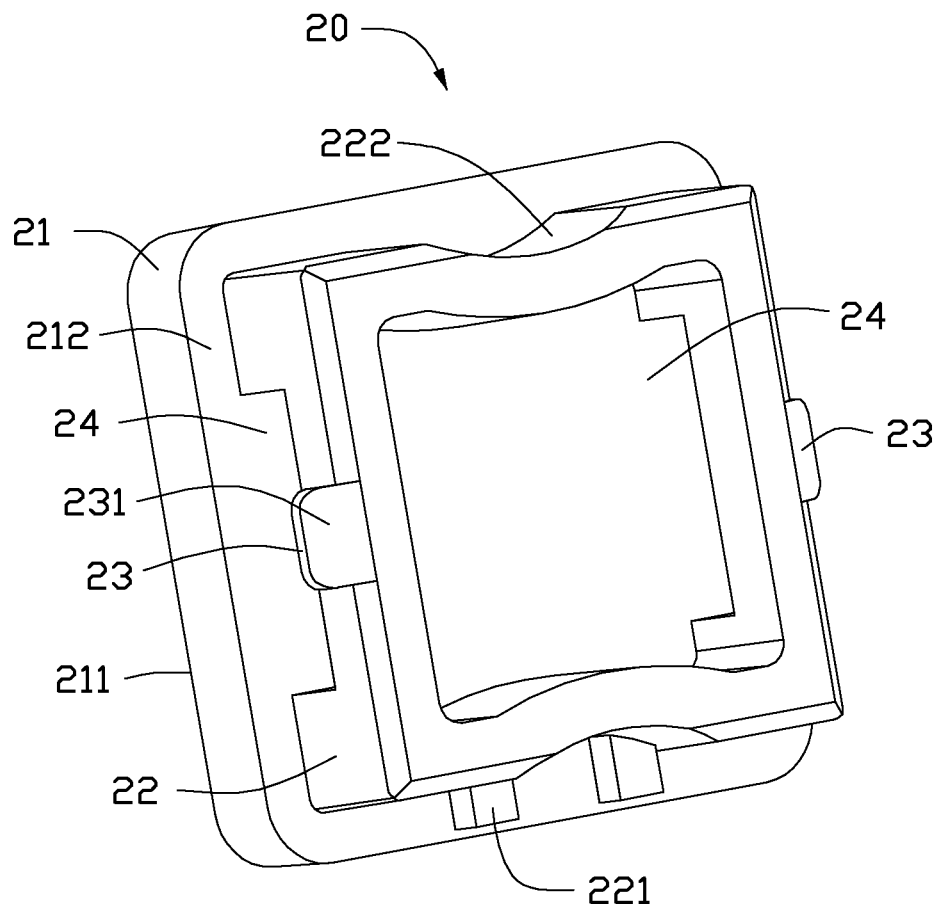
FIG. 5 is an isometric view of the protection cover of the electronic device of FIG. 1.

Referring to FIG. 5, the protection cover 20 includes a rectangular blocking plate 21, a hollow prismatic side wall 22 extending perpendicularly from the blocking plate 21, two clasping ears 23 respectively formed at two opposite sides of the side wall 22, and a through hole 24 defined in the centre of the side wall 22.

The protection cover 20 is made of organic glass or other non-rigid transparent material. The blocking plate 21 has a first surface 211 and an opposite second surface 212, and the side wall 22 extends outwardly from the second surface 212. Each clasping ear 23 resembles a wedge, having a facing surface (oblique surface 231) which slants outwards in the direction of the blocking plate 21.

When the protection cover 20 is pressed into the window 13 of the housing 10, the oblique surfaces 231 of the clasping ears 23 facilitate the insertion of the protection cover 20 into the window 13. The clasping ears 23 are to be held in the grooves 131b, 131d of the stepped structure 131, and the width of each clasping ear 23 is such that each of the clasping ears 23 is tightly fitted into the grooves 131b, 131d.

In addition, a recess 222 is defined at each opposite side of the side wall 22. In the manufacturing of the housing 10 by injection molding, the window 13 of the housing 10 acts as a pouring gate, some leftover overflow material may remain there and one or both of the recesses 222 can alleviate this problem of having leftover overflow material on the protection cover 20, thus it is advantageous for fixing the protection cover 20 onto the housing 10 smoothly.

Two position strips 221 as handing devices, to render the cover 20 asymmetric, are placed at and perpendicular to one side of the side wall 22 with the recess 222 defined thereon. Furthermore, the position strips 221 correspond to the groove 131c, that is, the position strips 221 can only be placed into the groove 131c, such that the protection cover 20 cannot be incorrectly assembled onto the housing 10.

The portions of the side wall 22 between the clasping ears 23 and the blocking plate 21 are removed to encourage elasticity in the side wall 22, and a fracture of the side wall 22 by deformation can be avoided.

Figure 6:
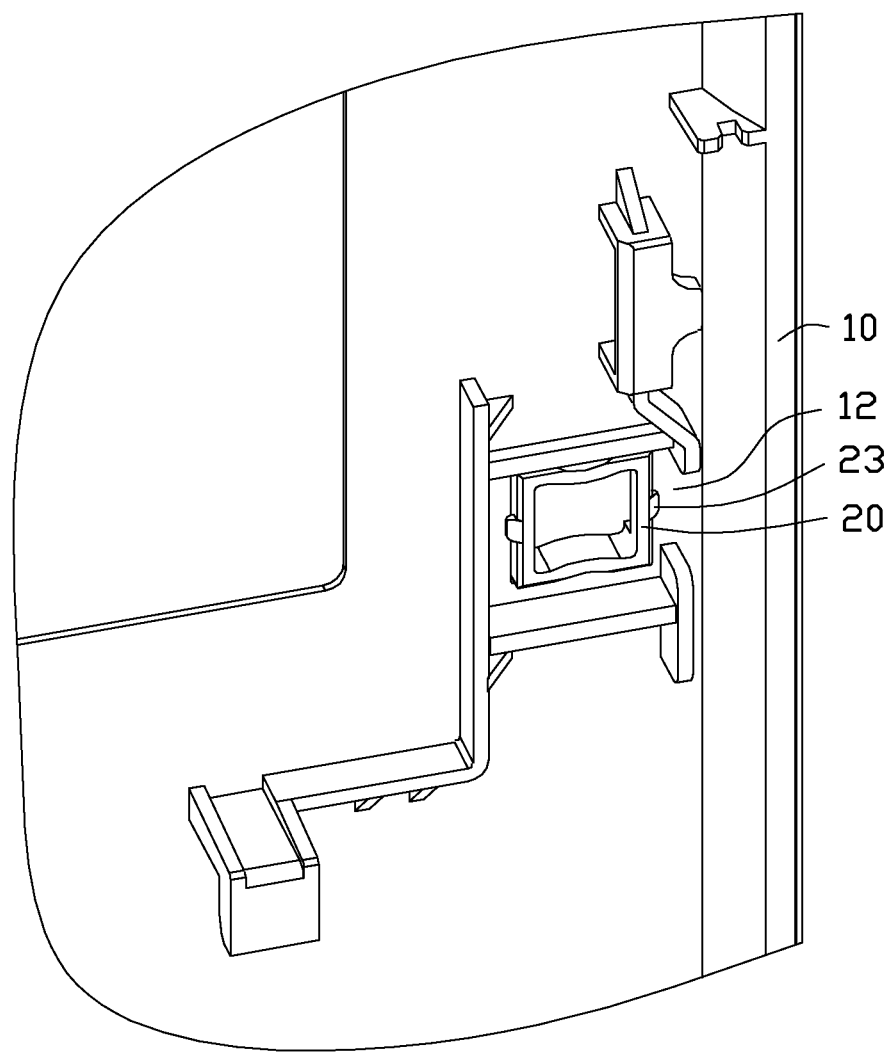
FIG. 6 is a schematic, enlarged view showing the protection cover assembled to the window of the electronic device.

Referring to FIG. 6, the inward deformation of the side wall 22 allows the placement of the protection cover 20 into the window 13, and the deformed side wall 22 is released after the clasping ears 23 have passed through the window 13, and the blocking plate 21 is simultaneously attached to the housing 10, as the two clasping ears 23 clasp onto the inner surface 12 of the housing 10. Therefore, the protection cover 20 is held securely in the housing 10 of the electronic device 100, for the protection of the IR receiving device 40 in the housing 10. In addition, when the protection cover 20 is fixed onto the window 13 of the housing 10, the first surface 211 of the blocking plate 21 will be flush with the outer surface 11 of the housing 10.

Although numerous characteristics and advantages of the present embodiments have been set forth in the foregoing description, together with details of the structures and functions of the embodiments, the disclosure is illustrative only, and changes may be made in detail, especially in the matters of shape, size, and arrangement of parts within the principles of the invention to the full extent indicated by the broad general meaning of the terms in which the appended claims are expressed.

What is claimed is:

1. An electronic device comprising:
   a housing comprising a window defined thereon;
   a circuit board received in the housing;
   an infrared receiving device received in the housing and electrically connected with the circuit board; and a protection cover engaged in the window of the housing to cover the infrared receiving device, the protection cover comprising a blocking plate, a side wall extending outwardly from the blocking plate, and two clasping ears respectively located at two opposite sides of the side wall, the blocking plate being attached to the housing, the two clasping ears of the protection cover being clasped onto the housing;

wherein the side wall defines a through hole in the centre thereof, and portions of the side wall between the clasping ears and the blocking plate are removed to communicate with the through hole, for encouraging elasticity in the side wall to avoid a fracture of the side wall by deformation during assembly when the protection cover engages in the window.

2. The electronic device of claim 1, wherein each clasping ear has an oblique surface slanting outwards in the direction of the blocking plate for insertion of the side wall into the window of the housing.

3. The electronic device of claim 1, wherein the protection cover is made of organic glass.

4. The electronic device of claim 1, wherein the window defines a stepped structure therein, and the blocking plate of the protection cover is attached to the stepped structure.

5. The electronic device of claim 4, wherein the stepped structure comprises two grooves defined at two opposite sides thereof, and locations of the grooves of the stepped structure are respectively corresponding to the clasping ears.

6. The electronic device of claim 5, wherein the side wall further comprises two recesses respectively defined at two opposite sides thereof between the two clasping ears.

7. The electronic device of claim 6, wherein the protection cover comprises a position strip defined at one side of the side wall with the recess defined thereon correspond to the groove of the stepped structure.

8. The electronic device of claim 1, wherein the protection cover is flush with the housing.

9. An electronic device comprising:
a housing comprising a window defined thereon;
a circuit board received in the housing;
an infrared receiving device received in the housing and electrically connected with the circuit board; and
a protection cover engaged in the window of the housing to cover the infrared receiving device, the protection cover comprising a blocking plate, a side wall extending outwardly from the blocking plate, and two clasping ears respectively located at two opposite sides of the side wall, the blocking plate being attached to the housing, the two clasping ears of the protection cover being clasped onto the housing;

wherein the window defines a stepped structure therein, and the blocking plate of the protection cover is attached to the stepped structure; wherein the stepped structure defines two grooves at opposite sides thereof, and locations of the grooves of the stepped structure are respectively corresponding to the clasping ears; wherein the side wall further comprises two recesses respectively defined at two opposite sides thereof between the two clasping ears; wherein the protection cover comprises a position strip defined at one side of the side wall with the recess defined thereon correspond to the groove of the stepped structure.

10. The electronic device of claim 9, wherein each clasping ear has an oblique surface slanting outwards in the direction of the blocking plate for insertion of the side wall into the window of the housing.

11. The electronic device of claim 9, wherein the side wall comprises a through hole defined in the centre thereof, and portions of the side wall between the clasping ears and the blocking plate are removed.

* * * * *